United States Patent [19]

Chatani

[11] 4,173,267

[45] Nov. 6, 1979

[54] SPEAKER CABINET

[75] Inventor: Ikuo Chatani, Yokohama, Japan

[73] Assignee: Sony Corporation, Tokyo, Japan

[21] Appl. No.: 827,350

[22] Filed: Aug. 24, 1977

[30] Foreign Application Priority Data

Sep. 3, 1976 [JP] Japan ................................ 51-105976

[51] Int. Cl.2 ........................ A47B 81/06; H05K 5/00

[52] U.S. Cl. ..................................... 181/199; 181/148

[58] Field of Search ............... 181/199, 148, 154, 149, 181/198, 175, 143; 179/1 E

[56] References Cited

U.S. PATENT DOCUMENTS

| | | | |
|---|---|---|---|
| 2,005,300 | 6/1935 | Pfalzer | 181/148 |
| 3,894,612 | 7/1975 | Maeda et al. | 181/199 |
| 3,989,909 | 11/1976 | Hodsdon et al. | 181/175 |
| 4,071,111 | 1/1978 | Croup | 181/199 |

FOREIGN PATENT DOCUMENTS

| | | | |
|---|---|---|---|
| 290433 | 11/1931 | Italy | 181/199 |

*Primary Examiner*—Stephen J. Tomsky
*Attorney, Agent, or Firm*—Hill, Van Santen, Steadman, Chiara & Simpson

[57] ABSTRACT

A speaker cabinet includes a baffle plate having at least one aperture for mounting a speaker unit, the baffle plate having a plurality of small areas over its entire surface and so constructed and arranged that the sound waves propagated along the surface of the baffle plate are scattered.

6 Claims, 14 Drawing Figures

SPEAKER CABINET

BACKGROUND OF THE INVENTION

1. Field of the Invention

This invention relates generally to a speaker cabinet and is directed more particularly to a speaker cabinet having an improved baffle plate upon which one or more speakers are mounted.

2. Description of the Prior Art

In the prior art, speaker cabinets have assumed many different shapes. One type of speaker cabinet has been of the box type, such as an air-tight base reflex type or the like, which has provision for sound absorption in the speaker cabinet or attached to the inner wall of the speaker cabinet. A network circuit is assembled on the speaker cabinet and a speaker unit is attached to an aperture in the baffle plate at either its front or rear side. In this case, the baffle plate is generally formed so that its surface is flat. Further, a grille net is attached to the outside of the baffle plate in such a way that the grille net faces the surface of the baffle plate at such a predetermined distance as to protect the speaker vibration element and which also serves as an ornament.

In some prior art speaker cabinets, a grille net is attached directly to the entire surface of a baffle plate to cover the vibration element. With such speaker cabinets there is the disadvantage that the grille net cannot be detached from the baffle plate, and the sound quality is deteriorated because the grille net covers the surface of the vibration plate.

As described above, since the baffle plate of the prior art speaker cabinet is formed to have a surface which is flat, the sound waves emitted from the speaker vibration element which is an actual sound source partially propagates along the surface of the baffle plate and then arrives at its edge where the portions of the baffle plate meet with the side, top and bottom walls of the cabinet. Due to the abrupt change in sound impedance which occurs at the edge, a sound wave is difracted at the edges. This gives the effect that the edge is serving as an imaginary sound source which emits therefrom a low intensity second sound wave. As a result, interference occurs between the sound wave from the speaker vibration element and the second wave from the imaginary sound source at the edges of the baffle plate. The frequency of the imaginary sound souce is dependent on a factor determined by the distance between the speaker vibration element and the end of the baffle plate. As a result, the sound pressure level at a point spaced from the speaker by a predetermined distance is altered in the vicinity of some specific frequency. In particular, a trough is produced in the sound pressure level at some particular frequency in the frequency response characteristic as measured in its middle band. This produces a deterioration of the sound quality. This deterioration becomes worse as the number of edges increases which exist at the same distance from the speaker unit.

With such a prior art speaker there exists a sound wave emitting not only from the vibration element of the speaker unit but also a sound wave from the baffle plate which is vibrated slightly by a sound wave produced in the cabinet. In the prior art where the baffle plate is a flat plate its vibration mode becomes specific thereto, and is limited to a specific frequency, with the result that the sound quality is seriously affected. This deterioration also seriously affects the directivity of the speaker.

OBJECTS AND SUMMARY OF THE INVENTION

Accordingly, an object of the present invention is to provide a speaker cabinet free from the above defects of the prior art speaker cabinets.

Another object of the present invention is to provide a speaker cabinet which has an improved sound-pressure-level to frequency characteristic.

A further object of the present invention is to provide a speaker cabinet having speaker units therein which has an improved directional characteristic.

A still further object of the present invention is to provide a novel speaker cabinet in which the above desired objects are obtained in an inexpensive manner.

In accordance with the present invention, there is provided a speaker cabinet having rear, side, base and top walls and a baffle plate which forms a front wall and has at least one speaker mounting hole, and in which the baffle plate has a plurality of areas on one surface thereof so constructed to provide improved response.

The other objects, features and advantages of the present invention will become apparent from the following description taken in conjunction with the accompanying drawings through which the like reference numerals designate like elements.

DESCRIPTION OF THE PREFERRED EMBODIMENTS

Figure 1:
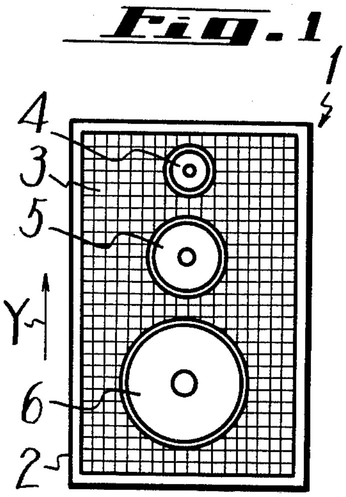
FIG. 1 is a front elevational view of a speaker cabinet having a baffle plate upon which the speaker units are mounted and which embodies the novel features of the present invention.

FIG. 1 is a front elevational view of the speaker 1 in which the speaker cabinet is formed of a frame-like construction formed by side walls, top and bottom walls and a rear wall secured to the aforesaid walls to form a frame which, in cross section, is rectangular in shape. These walls are identified as walls 2. The rear wall is not shown in FIG. 1. A baffle plate 3 is provided at the front, to which there are attached three speaker units such as a tweeter 4, a squawker 5, and a woofer 6 through openings provided in the baffle plate 3. The arrow Y designates the normal position in which the speaker 1 stands.

Figure 2:
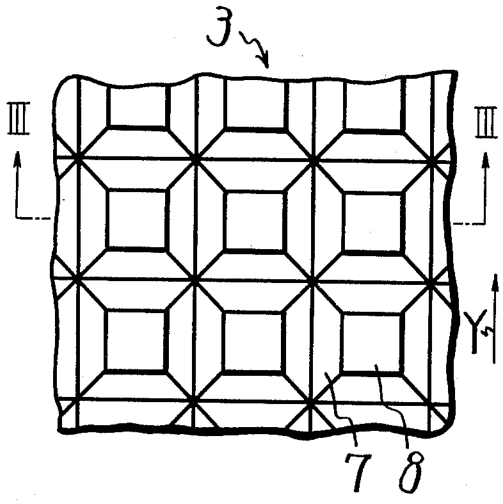
FIG. 2 is an enlarged fragmentary view of a part of the surface of the baffle plate shown in FIG. 1.
Figure 3:
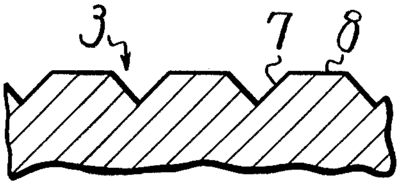
FIG. 3 is a cross-sectional view taken along the line III—III in FIG. 2.

In accordance with the present invention truncated pyramids are formed over substantially all of one surface of the baffle plate 3. For example, as shown in FIG. 2, there is an enlarged fragmentary plan view showing a part of baffle plate 3 and FIG. 3 which is a cross-sectional view taken along the line III—III of FIG. 2, a plurality of elongated grooves 7, each having a V-shaped cross section, are formed on one surface of baffle plate 3 in parallel with one another in rows and columns so that a plurality of truncated pyramids 8, each having a square flat top are formed on the surface of baffle plate 3 arranged in rows and columns. It is to be particularly noted that the side walls of the pyramids 8 are formed by the V-shaped grooves 7 and that the opposite sides of the pyramid walls are non-parallel as best shown in FIG. 3, this substantially improves the sound characteristics of the invention as discussed hereafter.

When the grooves 7 and truncated pyramids 8 are formed on the surface of baffle plate 3, a part of the sound which is emitted from the respective speaker units 4 to 6 and propagated along the surface of baffle plate 3 is reflected by the respective truncated pyramids 8, with the result that such sounds are scattered over the whole surface of baffle plate 3. Thus, there may be produced a number of second sound sources (imaginary sound sources) by sound reflection. In this case, however, since the reflected sounds from the second sound sources are very low in level and since their frequency characteristics differ from one another, interferences with the sound from the speaker units 4 to 6, are averaged, and hence total interference is greatly reduced as compared with that of the prior art in which sound reflection is caused at only the edge portion of the baffle plate.

The sound-pressure-level to frequency characteristic and the directivity to frequency characteristic of an example of the speaker cabinet according to the present invention will be explained with reference to the graphs of FIGS. 4 and 5 in which the ordinate represents the sound-pressure-level in dB and the abscissa represents frequency in Hz. In this case, the specimen is selected in size as follows:

The dimension of its speaker box:
Width is 510 mm.
Height is 930 mm.
Depth is 370 mm.
The dimension of the baffle plate 3 made of wood:
Thickness (from the upper surface of the truncated pyramid 8 to its rear surface) is 30 mm.
Distance between the centers of adjacent truncated pyramids 8 in row or column direction is 9 mm.
Depth of groove 7 is 6 mm.
Dimension of speaker units 4, 5 and 6:
Diameter of the opening for speaker unit 4 is 35 mm.
Diameter of the opening for speaker unit 5 is 100 mm.
Diameter of the opening for speaker unit 6 is 380 mm.

Figure 4:
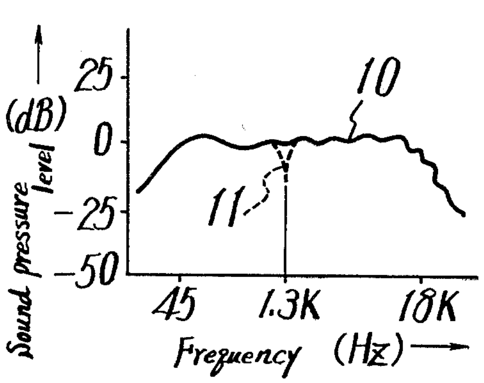
FIG. 4 is a graph showing the sound-pressure-level which is measured at a point on the front axis of the speaker unit assembly shown in FIG. 1 plotted against frequency to illustrate the frequency characteristic.

The sound-pressure-level to frequency characteristic of this specimen (on the front axis) is shown by a curve 10 (solid line curve) in the graph of FIG. 4 in which the ordinate represents the sound-pressure-level in dB and the abscissa represents the frequency in Hz. As is apparent from the graph of FIG. 4, the characteristic is approximately flat between low and high band cut-off frequencyes 45 Hz and 18 KHz where the sound-pressure-level is lowered by 3dB from the reference level 0dB. On the other hand, with the prior art speaker cabinet where the surface of a baffle plate is flat, the characteristic is modified as shown by the broken line portion 11 of the curve. At this point, the sound-pressure-level is lowered abruptly at the frequency 1.3 KHz and hence a trough is caused.

This illustrates the results obtained by providing the baffle plate 3 with the grooves 7 and truncated pyramids 8 and how the sound-pressure-level to frequency characteristic is affected at frequencies more than that corresponding to a wave length of about four times by arranging the depth of the grooves 7 or the distance between centers of the truncated pyramids 8 of baffle plate 3. Thus, it is sufficient that if the propagation velocity of sound is taken as 344m/sec, the above predetermined depth of groove or distance between centers of pyramids is more than about 4 mm, since the audible frequency of sound is lower than 20 KHz.

Further, according to the speaker cabinet of the invention, the grooves and pyramids formed on the surface of baffle plate 3 serve to lower the fundamental frequency of the vibration of baffle plate 3 and serve to produce many vibration modes as compared with the prior art. Hence, the vibration of the baffle plate is distributed over a wide frequency range and accordingly the affect of interferences on the sounds radiated from the speaker units in each direction is averaged. The sounds of high frequency bands (more than several KHz) which shows sharp directivity are scattered by the concavities or convexities, so that the sound-pressure-level to frequency characteristic is improved, and also the directional characteristic is improved.

Figure 5:
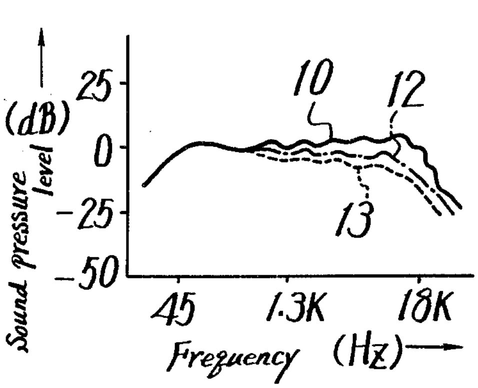
FIG. 5 is a graph of the sound-pressure-level to frequency characteristics as measured at a point at an axis inclined by 30° from the front axis of a prior art speaker as compared to a speaker as shown in FIG. 1.

The sound-pressure-level to frequency characteristic of this specimen (at an axis inclined by 30° from the front axis) is shown by a curve 12 (the one-dot chain line curve) in the graph of FIG. 5, from which it will be apparent that the sound-pressure-level is lowered from the sound-pressure-level to frequency characteristic curve 10 (on the front axis) but is higher than a sound-pressure-level to frequency characteristic curve 13 (on an axis inclined by 30° from the front axis) of the case where the surface of the baffle plate is made flat. Thus, it will be understood that the directivity in high frequency band is improved. This means that the tone quality is less affected by the position where a listener hears the sounds from the speaker units as compared with the prior art.

Other examples of the baffle plate, which are usable in the speaker cabinets of the invention with the same effect, will now be described.

A baffle plate 3 used in another example of speaker cabinets according to the invention will now be described with reference to FIG. 6, which is a top plan view of a part of a baffle plate 3, and FIG. 7 which is a cross-sectional view thereof.

Figure 6:
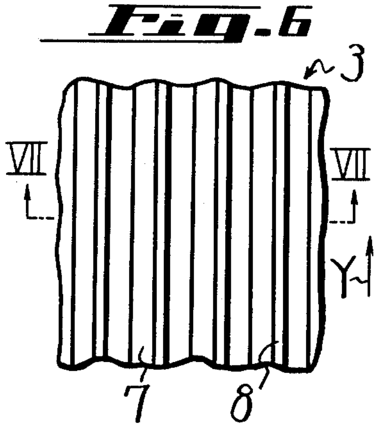
FIG. 6 is an enlarged fragmentary view showing a part of the surface of another baffle plate embodying the principles of the present invention.
Figure 7:
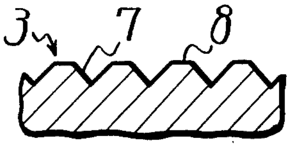
FIG. 7 is a cross-sectional view taken along the line VII—VII in FIG. 6.

In the example of FIGS. 6 and 7, a plurality of grooves 7, each of which has a V-shaped cross-section, are formed parallel with one another on one surface of baffle plate 3 in the column direction and hence a plurality of elongated ridges 8, each of which has a flat top surface.

Figure 8:
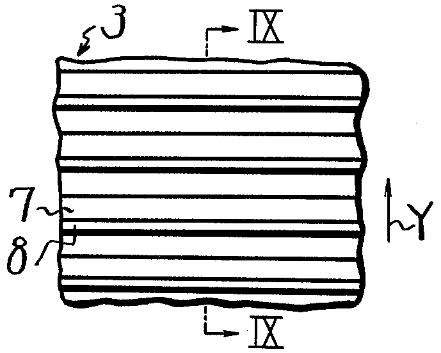
FIG. 8 is an enlarged fragmentary view showing a part of the surface of another baffle plate embodying the principles of the present invention.
Figure 9:
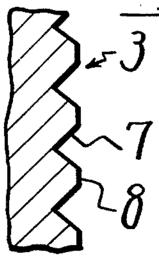
FIG. 9 is a cross-sectional view taken along the line IX—IX in FIG. 8.

A baffle plate 3 used in a further embodiment of the present invention is shown in FIG. 8, which is a top plan view of a part of the baffle plate and in FIG. 9, which is a cross-sectional view on the line IX—IX in FIG. 8.

In the embodiment of FIGS. 8 and 9, a plurality of grooves 7, each of which is substantially the same as the grooves 7 of FIGS. 6 and 7 in cross-section, are formed in parallel with one another on one surface of baffle plate 3 in a lateral direction at right angles to those of FIG. 6, and hence a plurality of flat top ridges 8 are formed, each of which is substantially the same as those of FIGS. 6 and 7 in cross-section.

Figure 10:
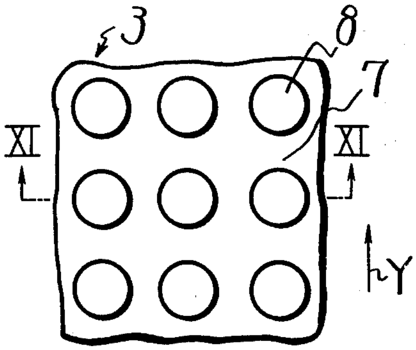
FIG. 10 is an enlarged fragmentary view showing a part of the surface of another baffle plate embodying the principles of the present invention.
Figure 11:
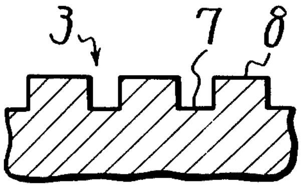
FIG. 11 is a cross-sectional view taken along the line XI—XI in FIG. 10.

FIG. 10 is a top plan view of a part of a baffle plate 3 forming another embodiment of the present invention, and FIG. 11 is a cross-sectional view on the line XI—XI in FIG. 10. In the baffle plate shown in FIGS. 10 and 11, in place of flat top ridges 8 there are provided a plurality of cylindrical projections 8 on one surface of baffle plate 3 in row and column directions in a matrix. These provide the desired irregular surface on the baffle plate 3, and perform the same effect as that of those described above.

Figure 12:
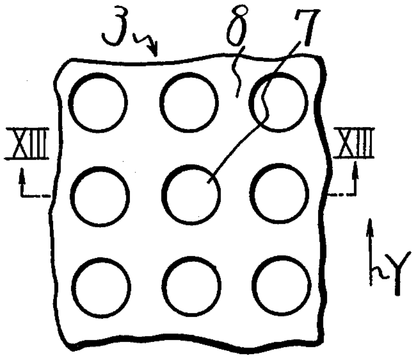
FIG. 12 is an enlarged fragmentary view showing a part of the surface of another baffle plate embodying the principles of the present invention.
Figure 13:
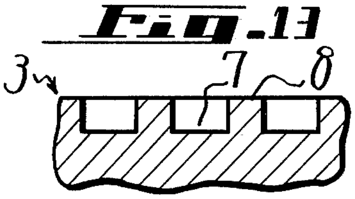
FIG. 13 is a cross-sectional view taken along the line XIII—XIII in FIG. 12.

FIG. 12 is a top plan view of a part of a baffle plate 3 of another embodiment of a speaker cabinet, and FIG. 13 is a cross-sectional view on the line XIII—XIII in FIG. 12. In the baffle plate 3 shown in FIGS. 12 and 13, a plurality of cylindrical recesses 7 are formed on one surface of baffle plate 3 in row and column direction in matrix in place of the cylindrical projections 8 of FIGS. 10 and 11. Thus, around the cylindrical recesses 7, there is provided what is the equivalent of the flat top projections 8.

In the above embodiments of the invention shown in FIGS. 1 to 3 and FIGS. 6 to 13, it is possible for the orientation of grooves 7 and pyramids 8 be rotated by an arbitrary angle relative to the column direction Y of baffle plate 3 and also that the shape of grooves or pyramids be changed arbitrarily.

The baffle plate 3 may be formed of soft or hard materials such as wood, plastic, paper fiber and other various materials such as sound absorbing materials.

Figure 14:
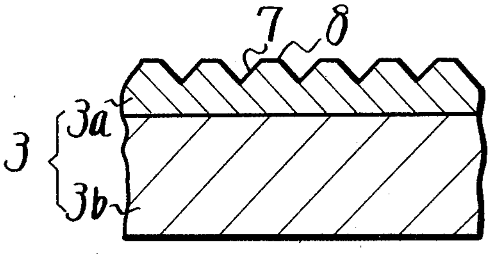
FIG. 14 is an enlarged fragmentary cross-sectional view of a portion of the baffle plate used in a further embodiment of the present invention.

The grooves or pyramids may be formed on the surface of the baffle plate 3 itself, or they may be formed, as shown in FIG. 14, on a baffle plate member 3*a* which is bonded to a flat baffle plate member 3*b*. In this case, it is easy to provide baffle plates 3 having various shapes of grooves and/or projections.

In the present invention, the dimension of the grooves or extensions is preferably selected to be several millimeters or more, depending on the response desired to the kind of speaker units employed, on their dimension, their characteristics, the dimension of the speaker box and its acoustic characteristics.

It will be apparent that many modifications and variations could be effected by one skilled in the art without departing from the spirit or scope of the novel concepts of the present invention so that the scope of the invention should be determined by the appended claims only.

I claim as my invention:

1. A speaker cabinet having rear, side, bottom and top walls, a baffle plate having front and back surfaces forming at least a portion of said front wall of said cabinet and formed with at least one speaker opening therein, one or more speakers mounted to said baffle plate on the front surface within said cabinet and each speaker aligned with an associated one of said speaker openings, a first plurality of generally V-shaped parallel grooves having non-parallel side walls formed in the front surface of said baffle plate, wherein the front side of said baffle plate is formed with a second plurality of generally V-shaped parallel grooves having non-parallel side walls formed in the front surface of said baffle plate and the orientation of said first and second plurality of parallel grooves being substantially normal to each other.

2. A speaker cabinet according to claim 1 wherein said first plurality of parallel grooves extend in the vertical direction.

3. A speaker cabinet according to claim 1 wherein a plurality of truncated pyramids are formed in said front surface of said baffle plate by the intersection of said first and second plurality of V-shaped grooves.

4. A speaker cabinet according to claim 1 wherein the spacing between adjacent ones of said first plurality of grooves is greater than 4 millimeters.

5. A speaker cabinet according to claim 4 wherein the depths of said grooves is a few millimeters.

6. A speaker having rear, side, bottom and top walls, a baffle plate having front and back surfaces forming at least a portion of said front wall of said cabinet and formed with at least one speaker opening therein, one or more speakers mounted to said baffle plate within said cabinet and each speaker aligned with an associated one of said speaker openings, a first plurality of grooves having non-parallel side walls formed in the front surface of said baffle plate, a second plurality of grooves having non-parallel side walls formed in the front surface of said baffle plate and the orientation of the first and second plurality of grooves being at an angle of approximately 90°, whereby a plurality of projections having non-parallel side walls are formed on said front surface of said baffle plate by the intersection of said first and second plurality of grooves.

* * * * *